(12) United States Patent
Ito et al.

(10) Patent No.: US 6,874,137 B1
(45) Date of Patent: Mar. 29, 2005

(54) DESIGN DATA PROCESSING METHOD AND RECORDING MEDIUM

(75) Inventors: Noriyuki Ito, Kawasaki (JP); Yoichiro Ishikawa, Kawasaki (JP); Hiroaki Hanamitsu, San Jose, CA (US); Ryoichi Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 88 days.

(21) Appl. No.: 09/708,572

(22) Filed: Nov. 9, 2000

(30) Foreign Application Priority Data

Nov. 10, 1999 (JP) .......................................... 11-320220

(51) Int. Cl.⁷ .............................................. G06F 17/50
(52) U.S. Cl. ................ 716/12; 716/2; 716/5; 716/6; 716/8; 716/9; 716/10; 716/11
(58) Field of Search ............................. 716/2, 5, 8–14

(56) References Cited

U.S. PATENT DOCUMENTS

| | | | | |
|---|---|---|---|---|
| 559,630 A | * | 5/1996 | Nishiyama et al. | .......... 364/490 |
| 5,627,999 A | * | 5/1997 | Cheng et al. | ............... 395/500 |
| 6,009,251 A | * | 12/1999 | Ho et al. | ........................ 716/5 |
| 6,223,327 B1 | * | 4/2001 | Yamaji | .......................... 716/5 |

* cited by examiner

*Primary Examiner*—Vuthe Siek
(74) *Attorney, Agent, or Firm*—Staas & Halsey LLP

(57) ABSTRACT

A design data processing method is a method of processing hierarchically configured design data, comprises the steps of: a) obtaining first design data of a predetermined rank of hierarchy; b) obtaining second design data of a rank of hierarchy higher than the predetermined rank of hierarchy; and c) combining the second design data to the first design data.

8 Claims, 20 Drawing Sheets

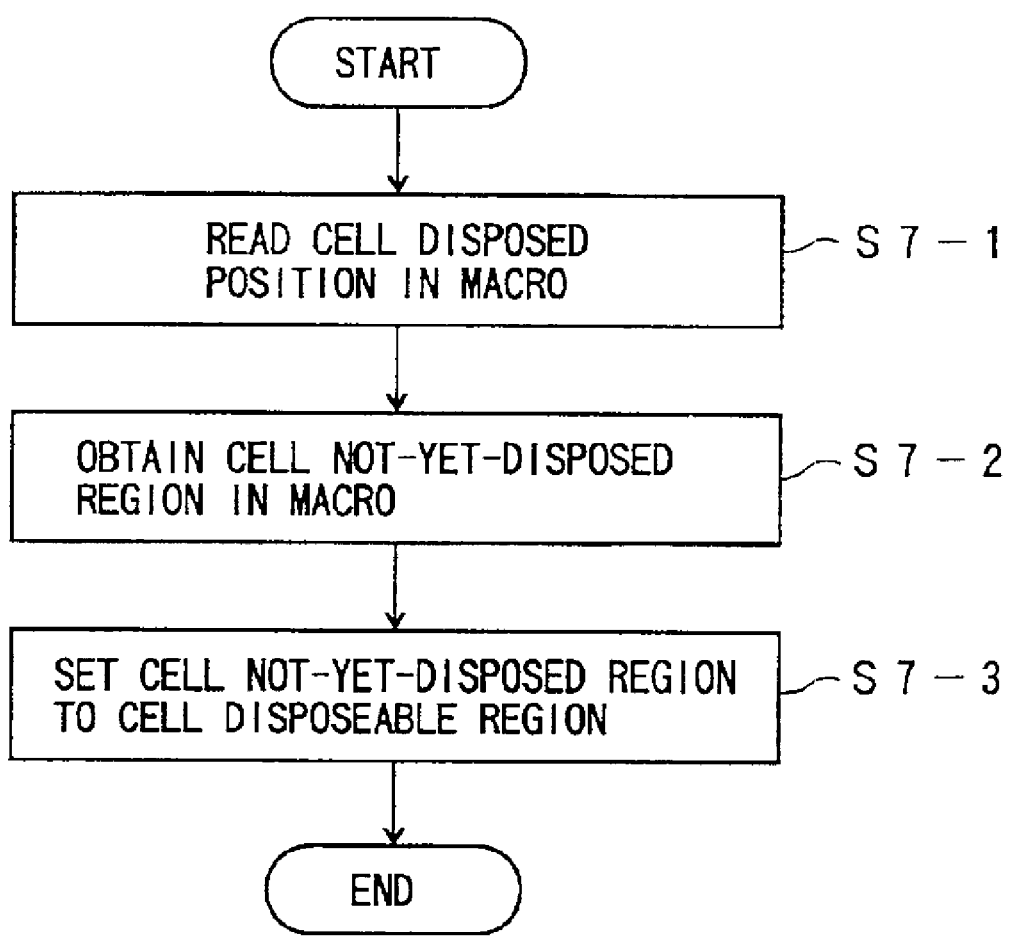

DESIGN DATA PROCESSING METHOD AND RECORDING MEDIUM

BACKGROUND OF THE INVENTION

1. Field of the Invention

The present invention relates to a design data processing method and a recording medium, in particular, to a design data processing method and a recording medium for design data obtained from designing an LSI (Large Scale Integrated) circuit for each rank of hierarchy in macro unit.

Recently, design of LSI circuit is made, in general, in such a manner that a layout of circuit is made hierarchically, macros being produced/created. In such a layout method, layouts between macros and between ranks of hierarchy are not easy to recognize. Accordingly, a layout method in which layouts between macros and between ranks of hierarchy can be efficiently recognized is demanded.

2. Description of the Related Art

In a hierarchical layout method of LSI circuit in the prior art, a design is made from a lower rank of hierarchy, in order, ordinarily. Thereby, when the same wiring layer is employed by an upper rank and a lower rank of hierarchy commonly, a design is made by a bottom-up manner. The layout method by the bottom-up manner is a method in which, when a layout of an upper rank of hierarchy is made, a lower rank of hierarchy is referred to.

In the hierarchical layout method in the related art, there is a limitation that no same wiring region is commonly used by an upper rank and a lower rank of hierarchy.

FIG. 1 illustrates one example of a wiring method between macros in the related art.

A layout structure 1 of a rank Ln of hierarchy in the related art includes macro blocks B1 through B8. When the macro block B1 and macro block B2 are connected to one another, a wire 2 is disposed in a manner such as to avoid the macro block B3 (corresponding to a wiring region of the lower rank of hierarchy) as shown in FIG. 1 due to the above-mentioned limitation on layout.

Further, in the hierarchical layout method in the related art, when a layout is made for an upper rank of hierarchy while the layout of lower rank of hierarchy is being displayed, wiring is inhibited for the lower rank of hierarchy. Only wiring to terminals for connecting macro blocks externally can be made.

FIG. 2 illustrates one example of a display of macro terminals in the related art.

An upper rank Ln of hierarchy has a macro block B0. The macro block Ln includes macro blocks B1 through B4. A lower rank Ln−1 of hierarchy has wires 3-1 through 3-8 disposed therein for connecting the periphery of the macro block B0 of the upper rank Ln externally.

In this case, when a layout is made for the upper rank Ln, wiring for the lower rank Ln−1 is inhibited. However, because the wires 3-1 through 3-8 have external wires connected thereto, terminals T1 through T8 are displayed at portions of the upper rank Ln corresponding to the wires 3-1 through 3-8. At this time, only wiring of portions of the terminals T1 through T8 is allowed.

Further, in the hierarchical layout method in the related art, there is a limitation of metal density due to characteristics of semiconductor. The limitation of metal density is a limitation in that, when a layout of metal of wires or the like is made, a ratio of an area occupied by the metal in a predetermined area is not larger than a predetermined value. In order to check this limitation, metal density rule check is performed in the hierarchical layout method in the related art.

FIG. 3 illustrates a method of metal density rule check in the related art.

In the metal density rule check, first, a layout region 4 is divided into a plurality of regions A11 through Amn each having a predetermined area S0. Then, each region of the regions A11 through Amn is extracted in sequence. Then, the area of the metal portion of the wires L1, L2 and L3 included in the extracted region is calculated.

Then, the metal density that is a ratio of the metal portion occupied in the region is obtained. For example, in the region A22, {(W1+W2)/S0}×100 (%); and in the region Am1, {(W3+W4)/S0}×100 (%). According to the metal density rule, it is prescribed that the metal density should be not more than 80%. When the metal density is more than 80%, it is determined that a metal density error is detected, and correction of the layout is required.

In this case, it is not possible to recognize the metal density rule at the time of the layout being originally made.

Further, in the layout method in the related art, a parallel line length is checked. The parallel line length check is a check made for detecting a noise error.

FIG. 4 illustrates a method of parallel line length check in the related art.

In FIG. 4, a wire 5-1 is a wire connecting a macro block B1 to a macro block B2, while a wire 5-2 is a wire connecting the macro block B1 to a macro block B3.

In the parallel line length check, the section L1 through which the wire 5-1 and wire 5-2 are parallel to one another is detected. When the section L1 is longer than a predetermined line length, it is determined that the amount of noise generated from an adjacent line is larger than a prescribed value, and, thus, it is determined that a noise error is detected.

Thus, in the layout method in the related art, the layout by the bottom-up manner is employed as described above in which a layout of a lower rank of hierarchy is referred to when a layout for an upper rank of hierarchy is made. Accordingly, when the layout for the lower rank is to be modified after the layout for the upper rank is made, it is not possible to refer to a wiring state and so forth of the upper rank of hierarchy. Therefore, the efficiency in layout is not satisfactory.

Further, in the layout method in the related art, as described above, when a macro block is connected externally, wiring in an inside periphery of the macro block is inhibited, only terminals are displayed at portions to be connected externally, and wires in the inside periphery of the macro block are not displayed. Accordingly, when a layout of wiring in an outside periphery of the macro block is made, it is not possible to examine separations between the external wires and internal wires of the macro block. Therefore, it is not possible to make layout of wires in consideration of influence between external and internal wires.

Further, recently, a density of wires has been increased, and the metal density rule has been severely applied. However, the metal density rule check is made after an original layout of all wires is made, and, therefore, it is not possible to make an original layout in consideration of the metal density rule. Thereby, the efficiency in layout is not satisfactory.

Further, because the detection of noise error is made from the parallel line length, wiring which does not actually result in a noise error is determined to cause a noise error. Therefore, a designer should check manually whether or not wiring determined to cause a noise error actually cause a noise error. Thereby, an enormous labor and time are required for a layout of wiring.

Further, in the related art, when a macro block includes a vacant space, because it is not allowed to dispose another macro block in one macro block, the vacant space remains as a useless space. This obstructs high-density integration of LSI circuit.

SUMMARY OF THE INVENTION

The present invention has been devised in consideration of the above-described situation, and, an object of the present invention is to provide a design data processing method and a recording medium by which it is possible to make an efficient layout in a hierarchically design of LSI circuit with high efficiency.

According to the present invention, the following steps are executed:
- step a) of obtaining first design data of a predetermined rank of hierarchy;
- step b) of obtaining second design data of a rank of hierarchy higher than the predetermined rank of hierarchy; and
- step c) of combining the second design data to the first design data.

Thereby, it is possible to display data of an upper rank of hierarchy in displayed data of a lower rank of hierarchy.

According to another aspect of the present invention, the following steps are executed:
- step a) of obtaining first design data of a block of the plurality of block of a predetermined rank of hierarchy;
- step b) of obtaining second design data of a rank of hierarchy lower than the predetermined rank of hierarchy; and
- step c) of displaying a peripheral portion of the block of the second design data, and setting the peripheral portion to a wiring inhibition region.

Thereby, because wiring of a peripheral portion of a block is displayed, it is possible to determine a layout of wiring outside of the block in an upper rank while recognizing the wiring inside of the block in a lower rank. Accordingly, it is possible to make wiring in conformity with wiring rule.

According to another aspect of the present invention, the following step is executed:
- step of producing the design data such that a metal density of the wiring is not more than a predetermined value, the step comprising the step of using design data in which a wire is previously split into a plurality of wires so that the metal density is not more than the predetermined value.

Thereby, it is possible to prevent a layout of wiring from deviating from metal density rule.

According to another aspect of the present invention, the following steps are executed:
- a first error detecting step of detecting a wiring error in accordance with a noise amount of wiring;
- a noise reducing step of reducing the noise amount in accordance with the state of wiring for which the wiring error is detected in the first error detecting step; and
- a second error detecting step of again detecting a wiring error in accordance with the noise amount obtained in the noise reducing step.

Thereby, in a case where a wiring error is detected for wiring first, when the state of the wiring is such that problematic noise is not likely to occur, it is finally determined that no wiring error is detected therefor. Accordingly, it is possible to reduce cases where it is finally determined that a wiring error is detected. In other words, it is possible to determine, with higher accuracy, that a wiring error is detected only when a problematic noise is actually generated when the thus-designed LSI circuit is actually manufactured.

According to another aspect of the present invention, the following steps are executed:
- step a) referring to a block layout of a predetermined block of a rank of hierarchy lower than a rank of hierarchy including the predetermined block;
- step b) detecting a region in which no block is disposed yet from the block layout of the lower rank referred to in the step a); and
- step c) setting the not-yet-disposed region detected in the step b) to such a region that another block can be disposed there.

Thereby, a block can be disposed in a region of another block, in which region no block is disposed yet. Thereby, it is possible to make a layout such that an area can be effectively used, and to increase circuit integration density of LSI circuit.

Other objects and further features of the present invention will become more apparent from the following detailed description when read in conjunction with the accompanying drawings.

BRIEF DESCRIPTION OF THE DRAWINGS

FIG. 19 shows an operation flow chart when a cell disposition is made in one embodiment of the present invention.

DETAILED DESCRIPTION OF THE PREFERRED EMBODIMENTS

Figure 1:
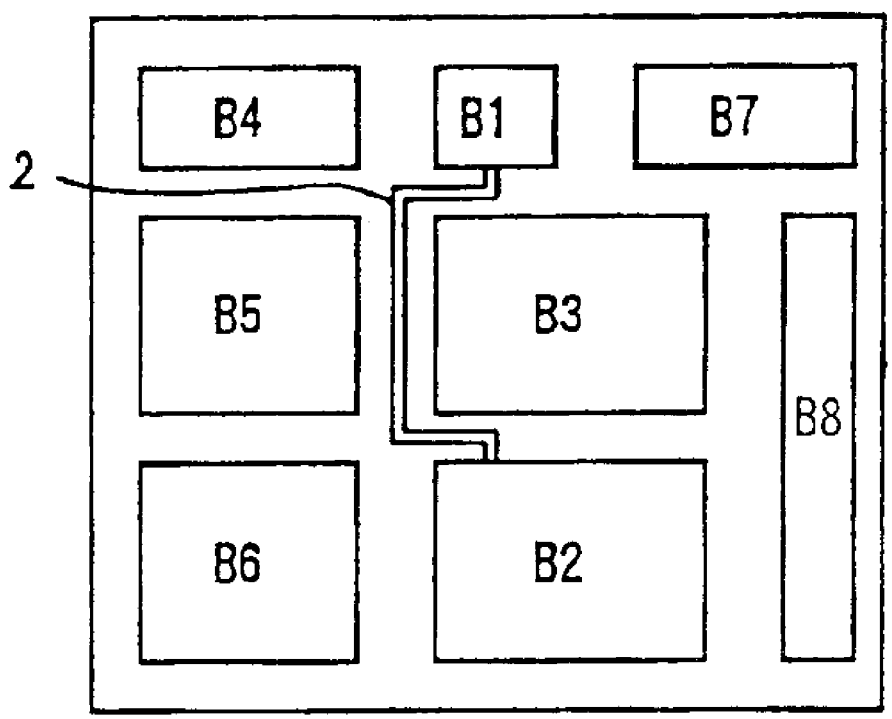
FIG. 1 illustrates one example of a method of wiring between macros in the related art.
Figure 2:
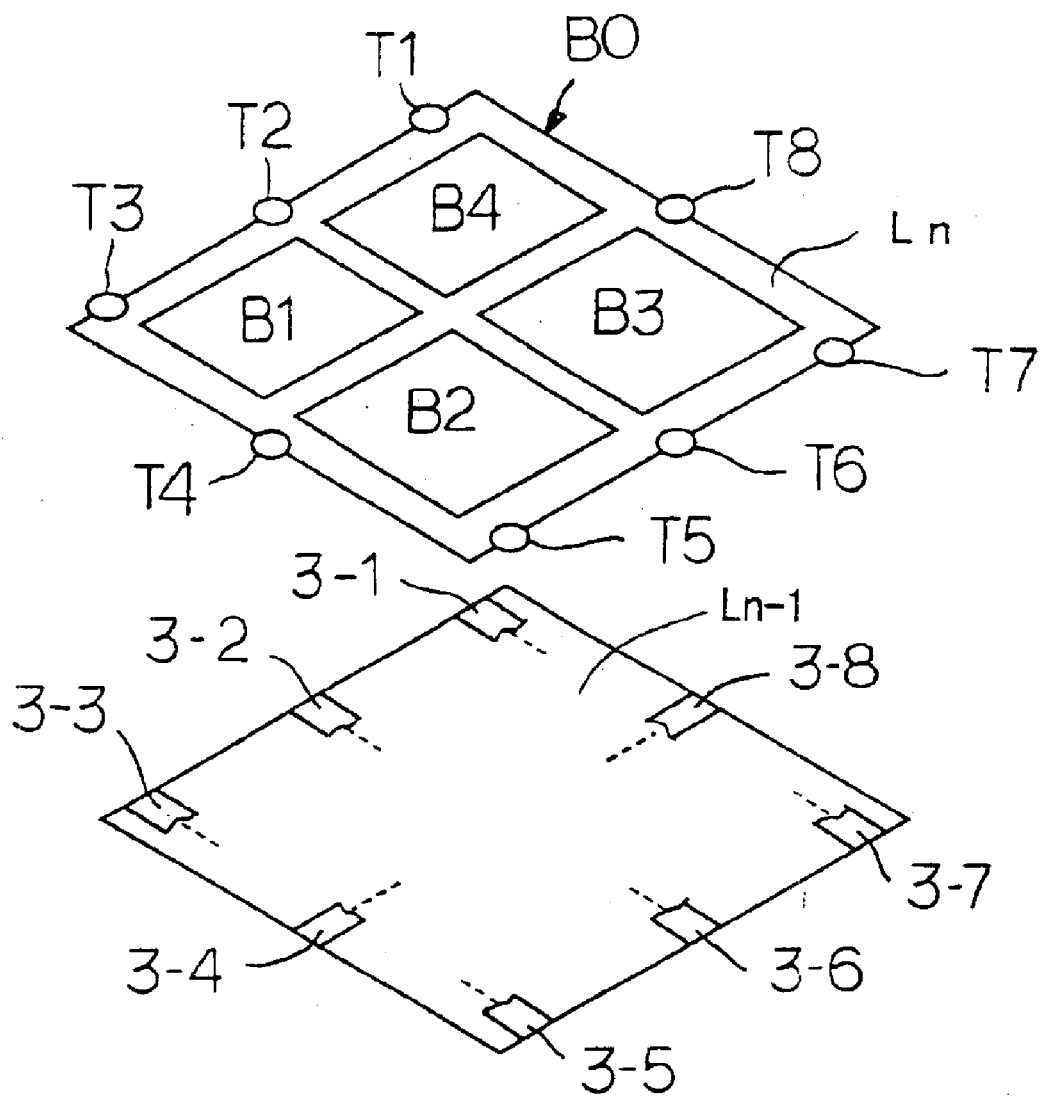
FIG. 2 illustrates one example of a display of macro terminals in the related art.
Figure 3:
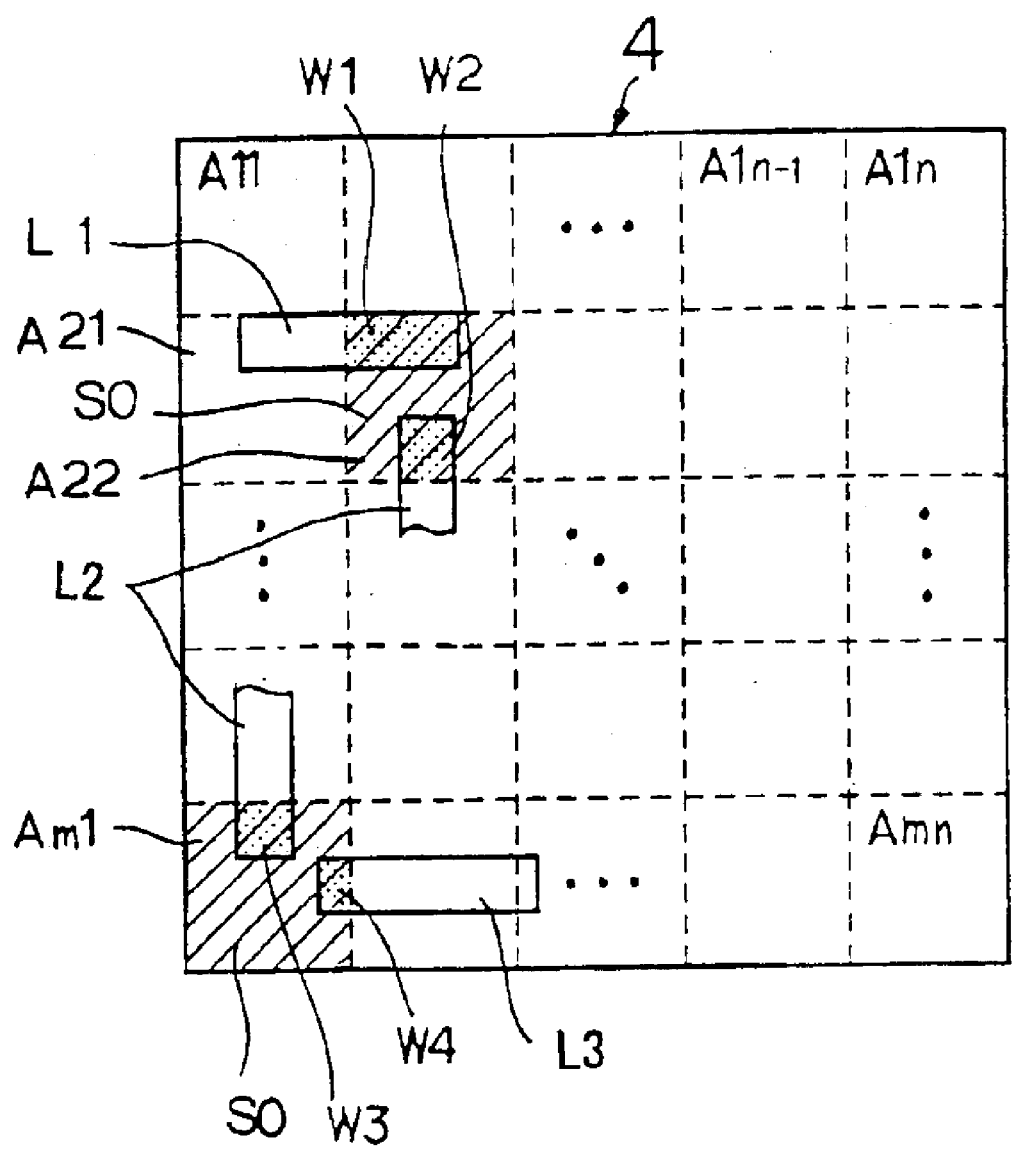
FIG. 3 illustrates a method of metal density rule check in the related art.
Figure 4:
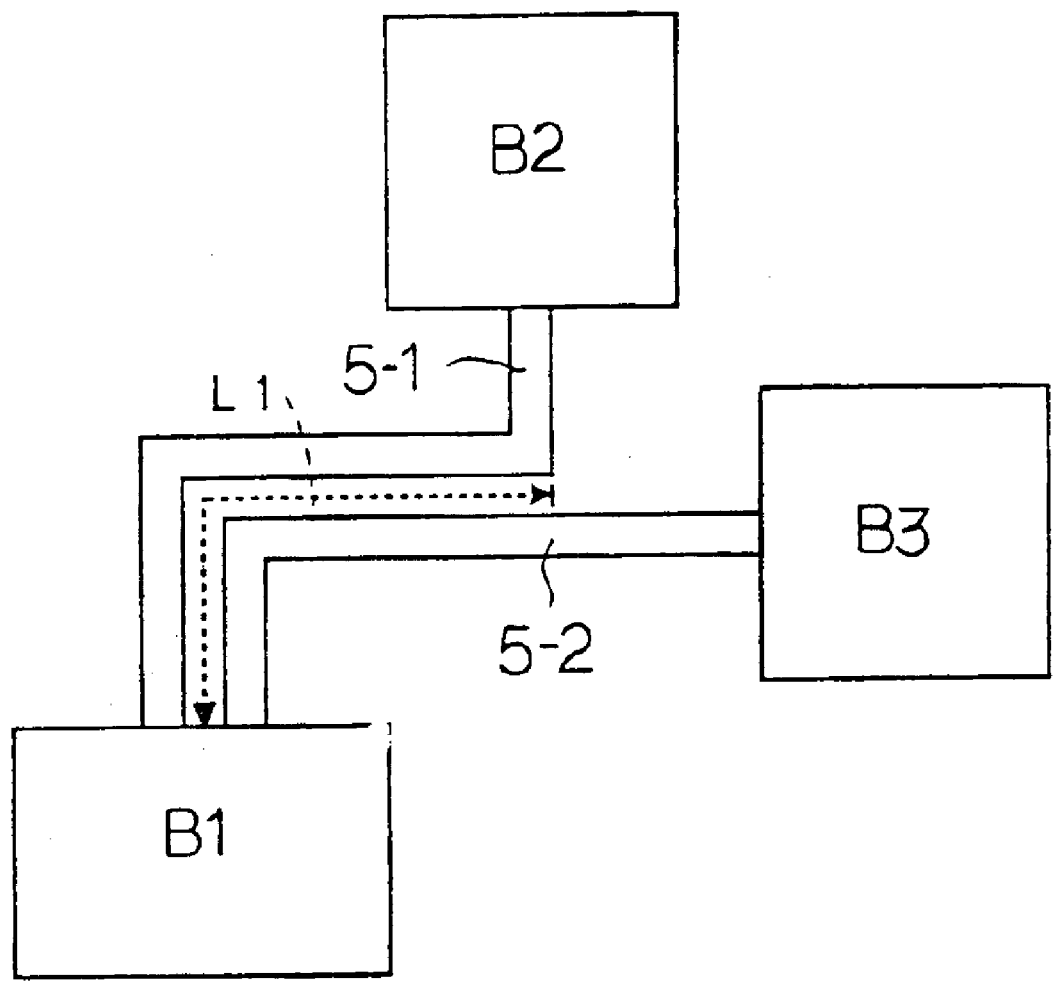
FIG. 4 illustrates a method of parallel length check in the related art.
Figure 5:
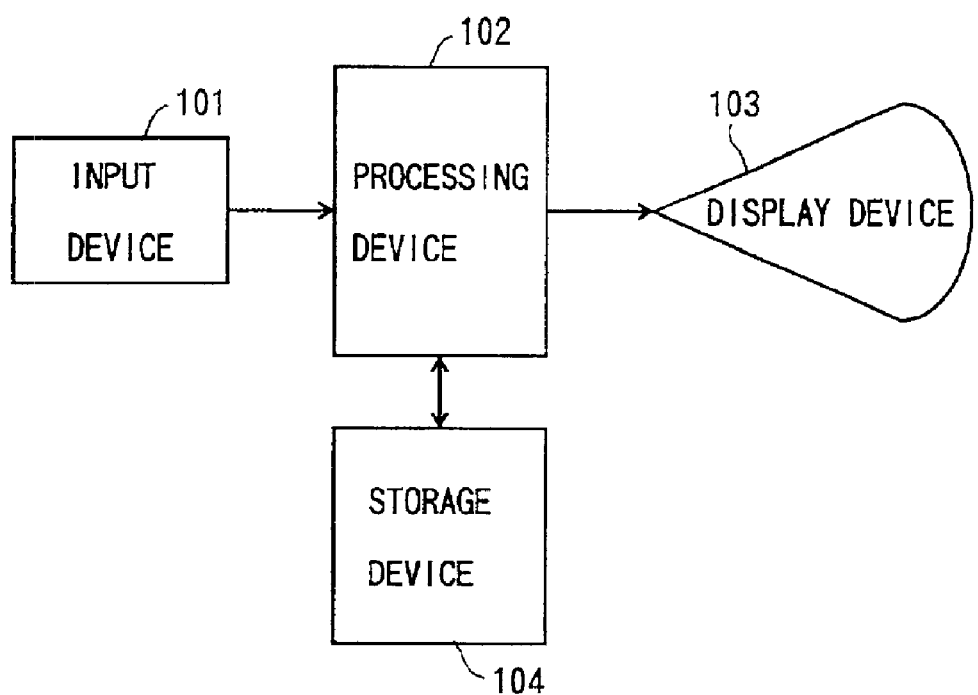
FIG. 5 shows a block diagram of one embodiment of the present invention.

FIG. 5 shows a block diagram of a design data processing system in one embodiment of the present invention.

The design data processing system 100 in the embodiment includes an input device 101, a processing device 102, a display device 103 and a storage device 104.

The input device 101 includes a keyboard, a mouse and so forth. A layout of LSI circuit and modification of the layout of LSI circuit is made by a user as a result of the input device 101 being operated by the user.

The processing device 102 (including a CPU and a memory such as a RAM, a ROM and so forth) reads out design data of LSI circuit from the storage device 104, modifies the layout in LSI circuit, and displays the layout in LSI circuit on the display device 103 in accordance with instructions input by a user through the input device 101. The storage device 104 includes a hard disk drive, and stores the design data, and a design data processing software program which will be described later.

The design data processing software program will now be described. However, it is noted that the design data processing software program may appropriately include instructions for performing all or only part of the steps of operations which will now be described.

Operations of the design data processing system 100 according to the design data processing software program when a top-down display is made will now be described.

Figure 6:
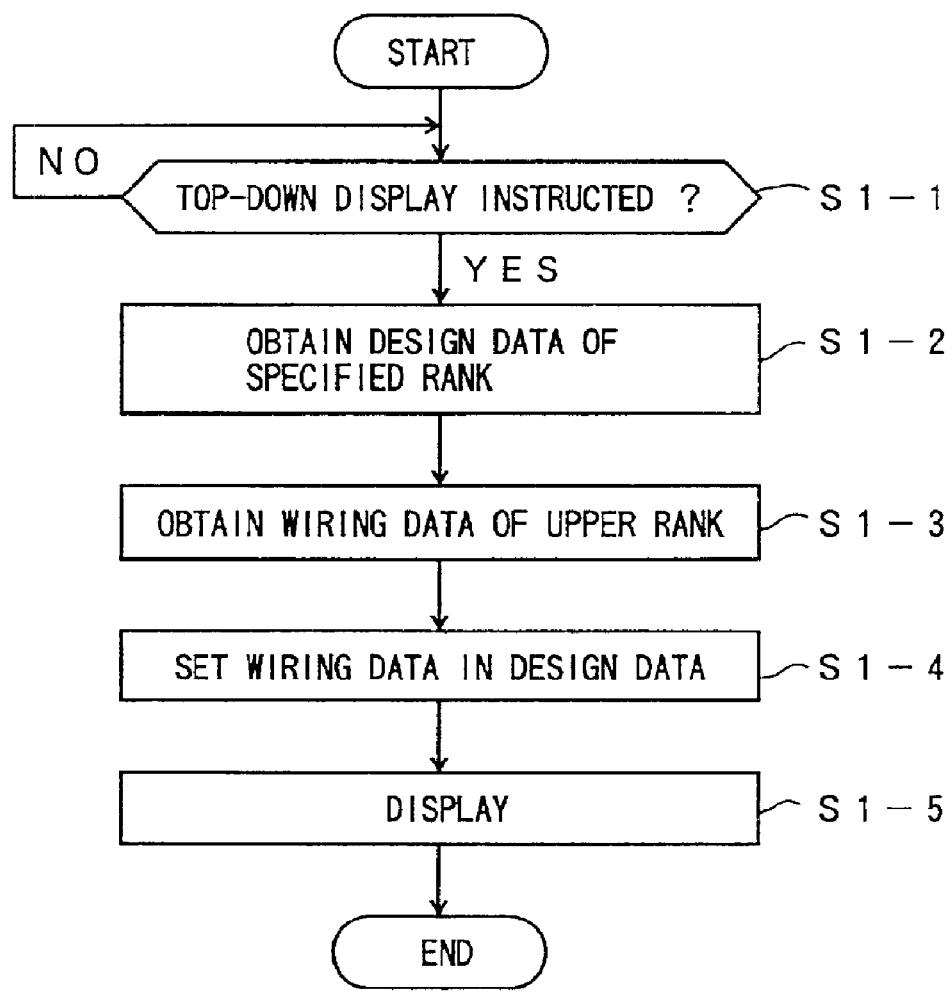
FIG. 6 shows an operation flow chart when a macro display is made in one embodiment of the present invention.

FIG. 6 shows an operation flow chart when the top-down display is made in one embodiment of the present invention.

The processing device 102 performs steps S1-1 through S1-5 shown in FIG. 6 by reading the above-mentioned design data processing software program when performing the top-down display. In the step S1-1, it is determined whether it is instructed to perform a top-down display by a user through the input device 101. When it is determined in the step S1-1 that it is instructed to perform an top-down display, design data of a rank of the hierarchically designed layout data of LSI circuit is obtained from the storage device 104 in the step S1-2, which rank is specified by the user through the input device 101. Then, in the step S1-3, wiring data of the upper rank of the hierarchically designed layout data of LSI circuit is obtained from the storage device 104.

In the step S1-4, the wiring data of the upper rank obtained in the step S1-3 is set in the design data of the specified rank obtained in the step S1-2. In the step S1-5, the design data of the specified rank in which the wiring data of the upper rank is set is displayed on the display device 103.

Figure 7A:
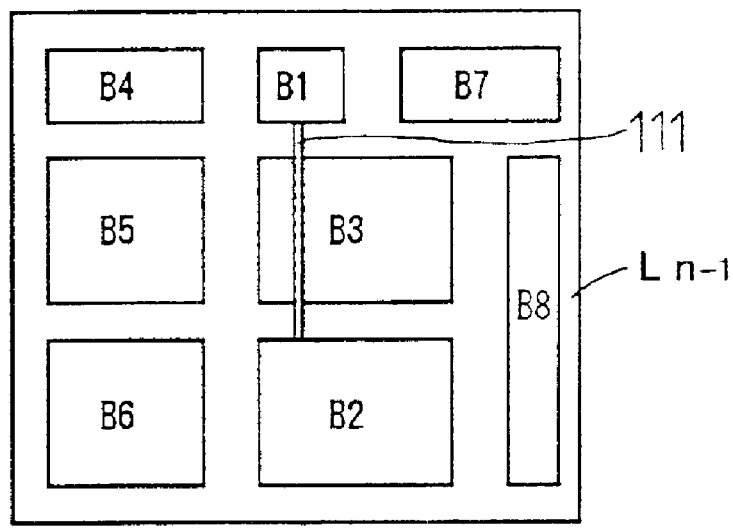
FIGS. 7A and 7B illustrate one example of operations according to the flow chart shown in FIG. 6.
Figure 7B:
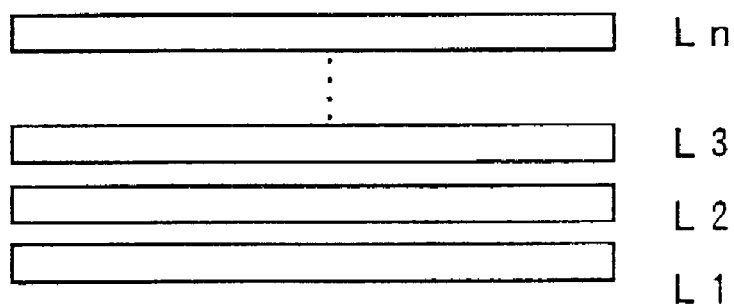

FIGS. 7A and 7B illustrate an example of the top-down display according to the flow chart shown in FIG. 6.

A layout structure 110 includes ranks L1 through Ln of the hierarchically designed layout data of LSI circuit as shown in FIG. 7B. The rank Ln−1 thereof includes macro blocks B1 through B8 as shown in FIG. 7A.

The rank Ln is the upper rank of the rank Ln−1, and includes a wire 111 connecting the macro blocks B1 and B2.

The wire 111 is disposed in such a manner to cross the macro block B3 as shown in the figure.

In this example, when the layout of the lower rank Ln−1 is modified, the wiring 111 of the upper rank Ln is displayed together with the layout of the rank Ln−1, as shown in FIG. 7A.

Operations of the design data processing system 100 according to the design data processing software program when a bottom-up display is made will now be described.

Figure 8:
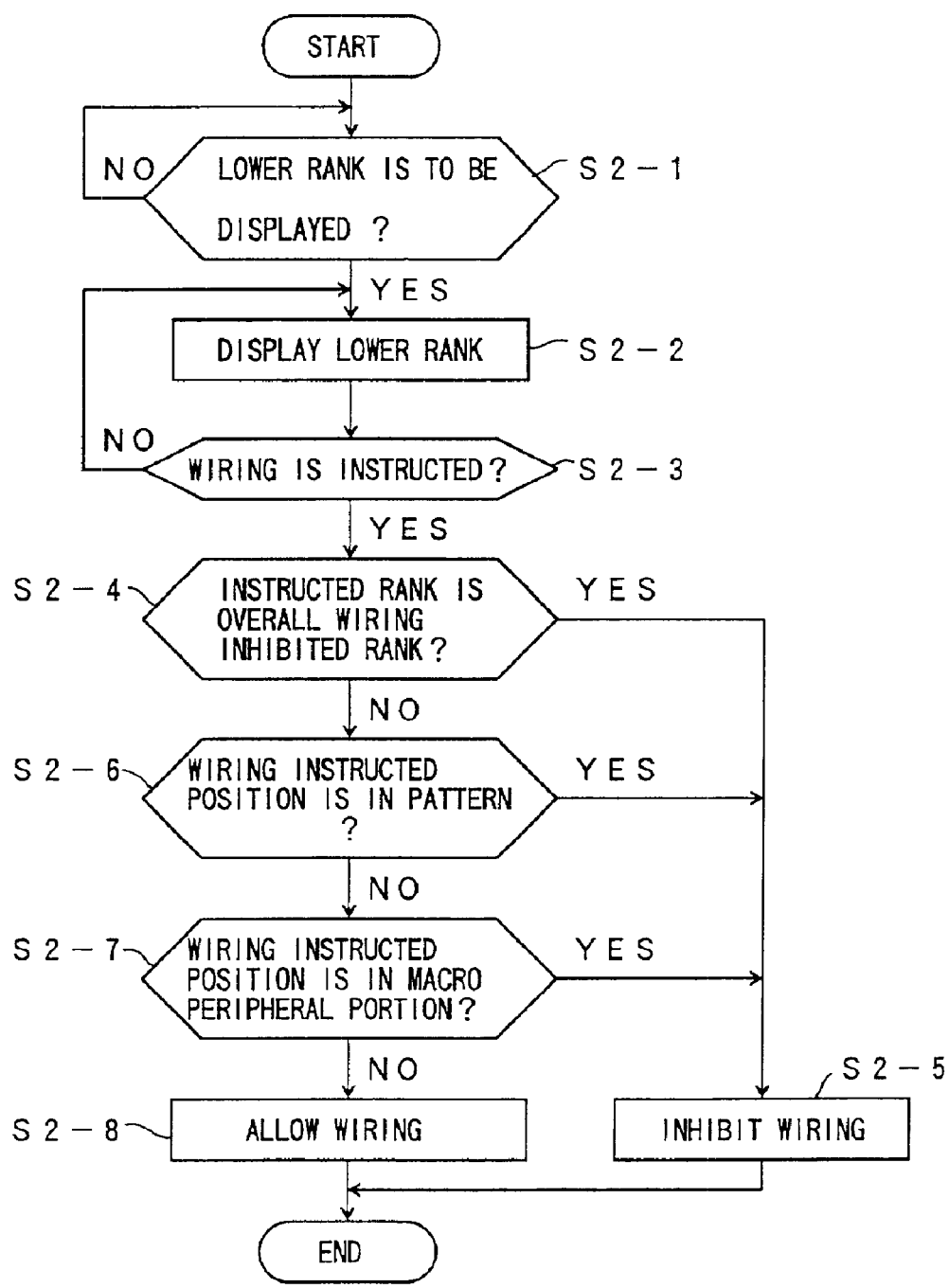
FIG. 8 shows an operation flow chart when a hierarchy display is made in one embodiment of the present invention.

FIG. 8 shows an operation flow chart when the bottom-up display is made in one embodiment of the present invention.

The processing device 102 performs steps S2-1 through S2-8 shown in FIG. 8 by reading the design data processing software program when performing the bottom-down display.

In the step S2-1, it is determined whether or not it is instructed to display the lower rank of the hierarchically designed layout data of LSI circuit. When it is determined in the step S2-1 that it is instructed to display the lower rank, the lower rank is displayed together with the upper rank of the hierarchically designed layout data of LSI circuit.

In the step S2-3, it is determined whether or not a layout of wiring is instructed to be made. When it is determined in the step S2-3 that a layout of wiring is instructed to be made, it is determined in the step S2-4 whether or not a layout of wiring is inhibited for the rank of the hierarchically designed layout data of LSI circuit for which the layout of wiring is instructed to be made in the step S2-3.

When it is determined in the step S2-4 that a layout of wiring is inhibited for overall the rank for which the layout of wiring is instructed to be made, the layout of wiring is inhibited in the step S2-5.

When it is determined in the step S2-4 that a layout of wiring is not inhibited for overall the rank for which the layout of wiring is instructed to be made, it is determined in the step S2-6 whether or not the position at which a layout of wiring is instructed to be made is in a conductor pattern. When it is determined in the step S2-6 that the position at which the layout of wiring is instructed to be made is in a conductor pattern, the layout of wiring is inhibited in the step S2-5.

When it is determined in the step S2-6 that the position at which the layout of wiring is instructed to be made is not in a conductor pattern, it is determined in the step S2-7 whether or not the position at which the layout of wiring is instructed to be made is in a peripheral portion of a macro block. The peripheral portion of a macro block is a region of the macro block within a predetermined distance from the surrounding edge of the macro block.

When it is determined in the step S2-7 that the position at which the layout of wiring is instructed to be made is in the peripheral portion of the macro block, the layout of wiring is inhibited in the step S2-5. When it is determined in the step S2-7 that the position at which the layout of wiring is instructed to be made is not in the peripheral portion of the macro block, the layout of wiring is allowed.

Figure 9:
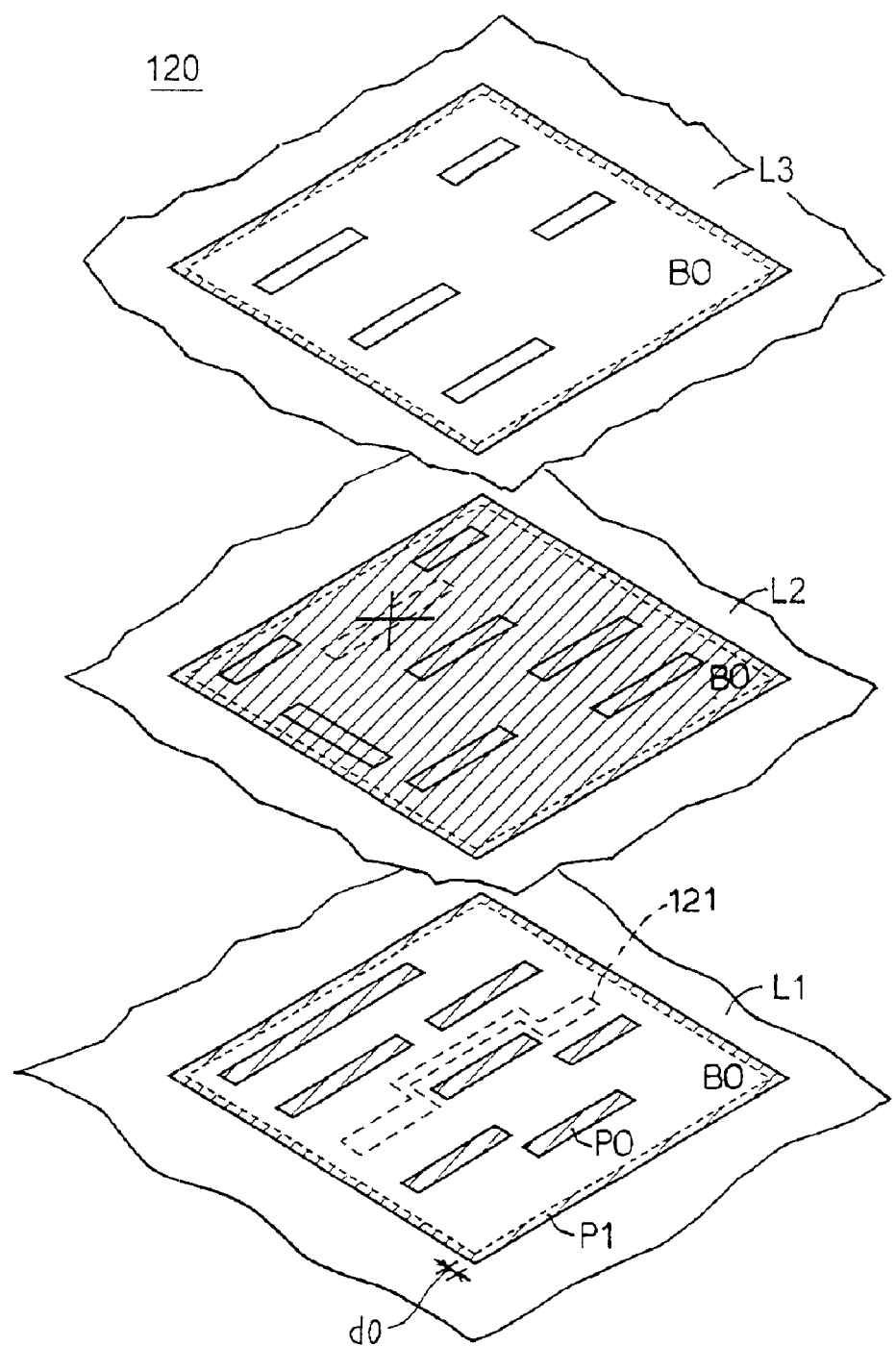
FIG. 9 illustrates one example of operations according to the flow chart shown in FIG. 8.

FIG. 9 shows one example of displaying ranks of the hierarchically designed layout data of LSI circuit.

In FIG. 9, a rank L3 is an upper rank of the hierarchically designed layout data of LSI circuit, and ranks L2 and L1 are lower ranks of the hierarchically designed layout data of LSI circuit. The lower rank L2 is a rank for overall which a layout of wiring is inhibited. Accordingly, no layout of wiring is allowed for the rank L2.

With regard to the rank L1, a layout of wiring only in conductor patterns is inhibited. Accordingly, a layout of wiring 121 is allowed except in the patterns P0 and in the peripheral portion P1 of a macro block B0.

At this time, the peripheral portion P1 is a region of the macro block B0 within a predetermined distance d0 from the surrounding edge of the macro block B0. In the peripheral portion P1, a layout of wiring of the ranks L1 and L2 is made, the layout of wiring of the ranks L1 and L2 in the peripheral portion P1 is displayed, and the peripheral portion P1 is set to a wiring inhibition region. Accordingly, when a layout of wiring is to be made in the proximity of the macro block B0 in the upper rank L3, it is possible to make the layout of wiring in consideration of the layout of wiring inside of the macro block B0 in the lower ranks L1 and L2. Thereby, it is possible to secure spacing from wires of the layout of wiring inside of the macro block B0.

Operations of the design data processing system 100 according to the design data processing software program when a layout of wiring is made will now be described.

Figure 10:
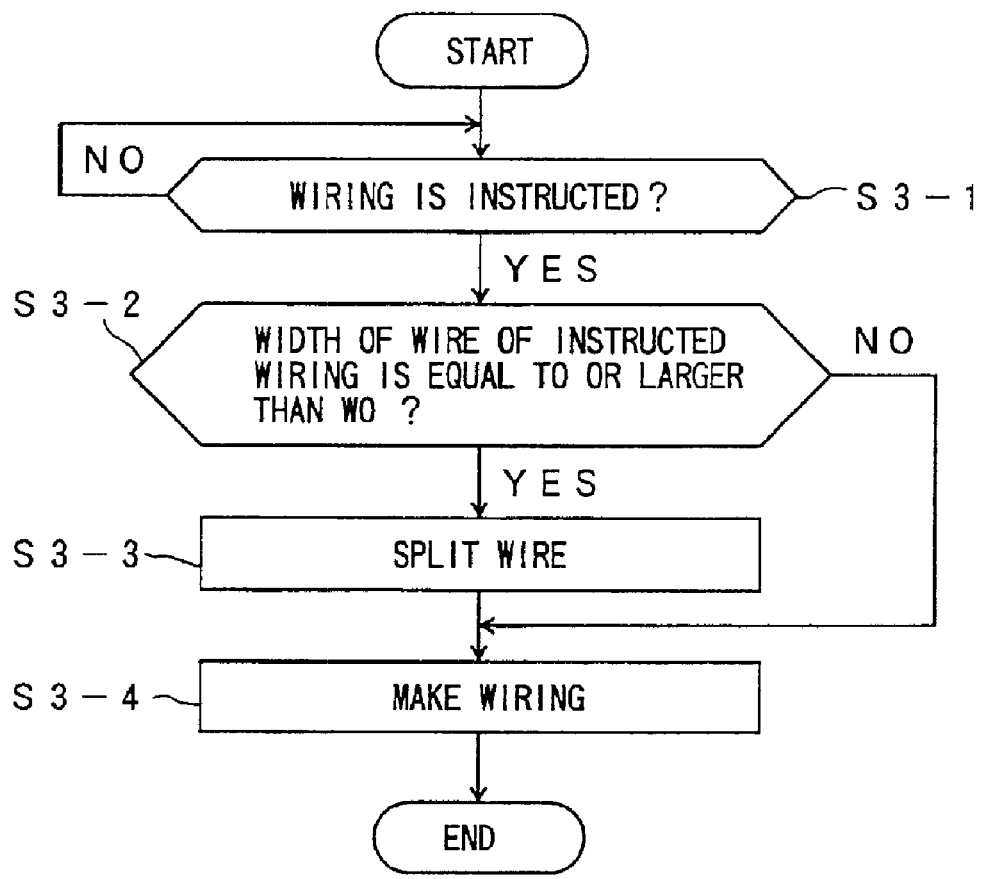
FIG. 10 shows an operation flow chart when a wiring is made in one embodiment of the present invention.

FIG. 10 shows an operation flow chart when a layout of wiring is made in one embodiment of the present invention.

The processing device 102 performs steps S3-1 through S3-4 shown in FIG. 10 by reading the design data processing software program when making a layout of wiring.

In the step S3-1, it is determined whether or not a layout of wiring is instructed to be made.

When it is determined in the step S3-1 that a layout of wiring is instructed to be made, it is determined in the step S3-2 whether or not the width of wire of the instructed layout of wiring is equal to or larger than a predetermined width W0. A wire having a width equal to or larger than the predetermined width W0 is used as a supply line of a clock signal or power supply.

When it is determined in the step S3-2 that the width of wire of the instructed layout of wiring is equal to or larger than the predetermined width W0, the wire of the instructed layout of wiring is split into a plurality of wires in the step S3-3, and a pattern of the thus-obtained plurality of wires is used for the instructed layout of wiring in the step S3-4.

Figure 11A:
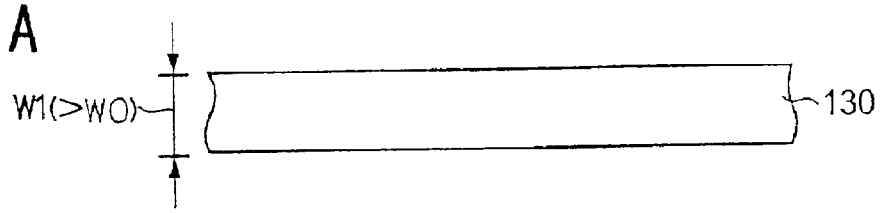
FIGS. 11A and 11B illustrate one example of operations according to the flow chart shown in FIG. 10.
Figure 11B:
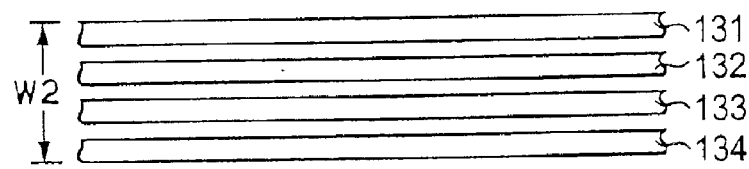

FIGS. 11A and 11B illustrate one example of a layout of wiring according to the flow chart shown in FIG. 10. FIG. 11A shows a wire in an instructed form, and FIG. 11B shows the wire in an actually employed form.

When the wire 130 having the width W1 larger than the predetermined width W0 is included in an instructed layout of wiring as shown in FIG. 11A, the wire 130 is split into the four wires 131 through 134, for example, each having the width W1/4. Thereby, the overall width of the wires is W2 (>W1), as shown in FIG. 11B.

Thereby, it is possible to reduce the density of wiring. Thus, it is possible to prevent the above-described metal density error otherwise occurring due to a single thick wire from occurring.

Operations of the design data processing system 100 according to the design data processing software program when a layout of wiring in a first variant manner of the manner described above with reference to FIGS. 10, 11A and 11B is made will now be described.

Figure 12:
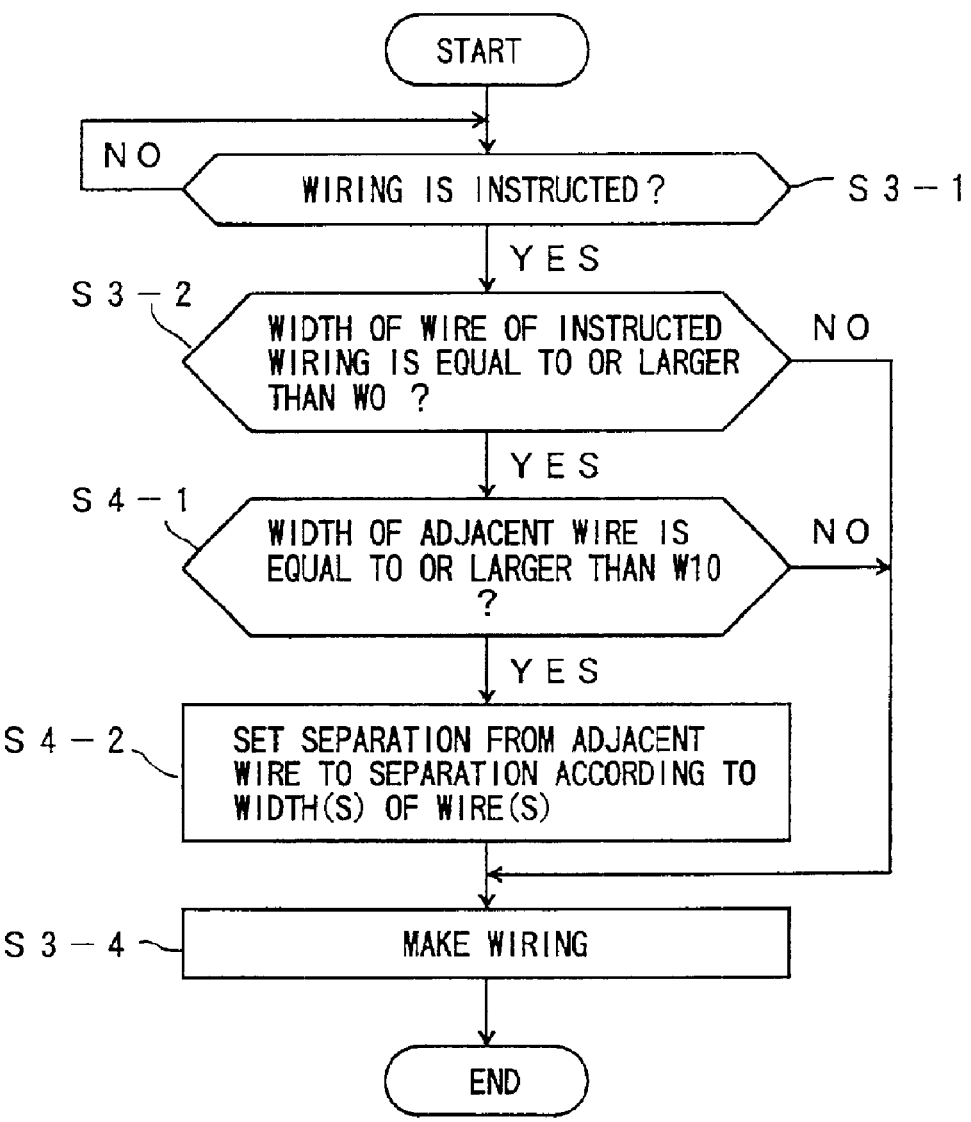
FIG. 12 shows an operation flow chart when a wiring in a first variant manner is made in one embodiment of the present invention.

FIG. 12 shows an operation flow chart when a layout of wiring is made in the first variant manner in one embodiment of the present invention. In FIG. 12, the same step numbers are given to the steps the same as those shown in FIG. 10, and description thereof is omitted.

The processing device 102 performs steps S3-1, S3-2, S4-1, S4-2 and S3-4 shown in FIG. 12 by reading the design data processing software program when making a layout of wiring in the first variant manner.

When it is determined in the step S3-2 that the width of wire of the instructed layout of wiring is equal to or larger than the predetermined width W0, it is determined in the step S4-1 whether or not the width of the adjacent wire is equal to or larger than a predetermined width W10.

When it is determined in the step S4-1 that the width of the adjacent wire is equal to or larger than the predetermined width W10, the separation from the adjacent wire is set to a separation equal to or larger than a predetermined length.

Figure 13A:
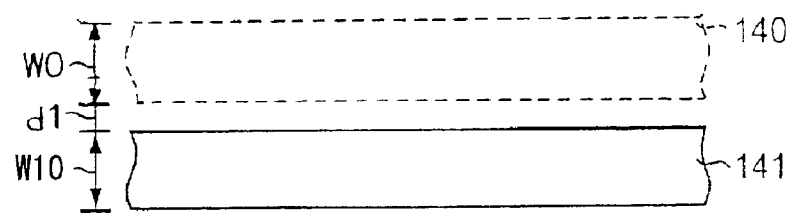
FIGS. 13A and 13B illustrate one example of operations according to the flow chart shown in FIG. 12.
Figure 13B:
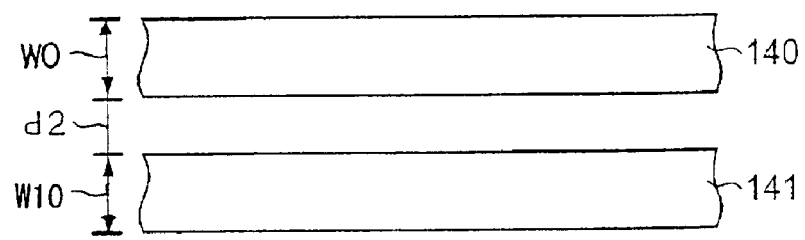

FIGS. 13A and 13B illustrate one example of a layout of wiring according to the flow chart shown in FIG. 12.

When a layout of wiring is instructed to be made such that a wire 140 having a width W0 is disposed adjacent to a wire 141 having a width W10 with a separation d1 therebetween, as shown in FIG. 13A, a layout of wiring is made such that the separation between the wires 140 and 141 is set to a separation d2 (>d1), as shown in FIG. 13B.

Accordingly, it is possible to reduce the density of wiring. Thus, it is possible to prevent the above-described metal density error from occurring.

Operations of the design data processing system 100 according to the design data processing software program when a layout of wiring in a second variant manner of the manner described above with reference to FIGS. 10, 11A and 11B is made will now be described.

Figure 14:
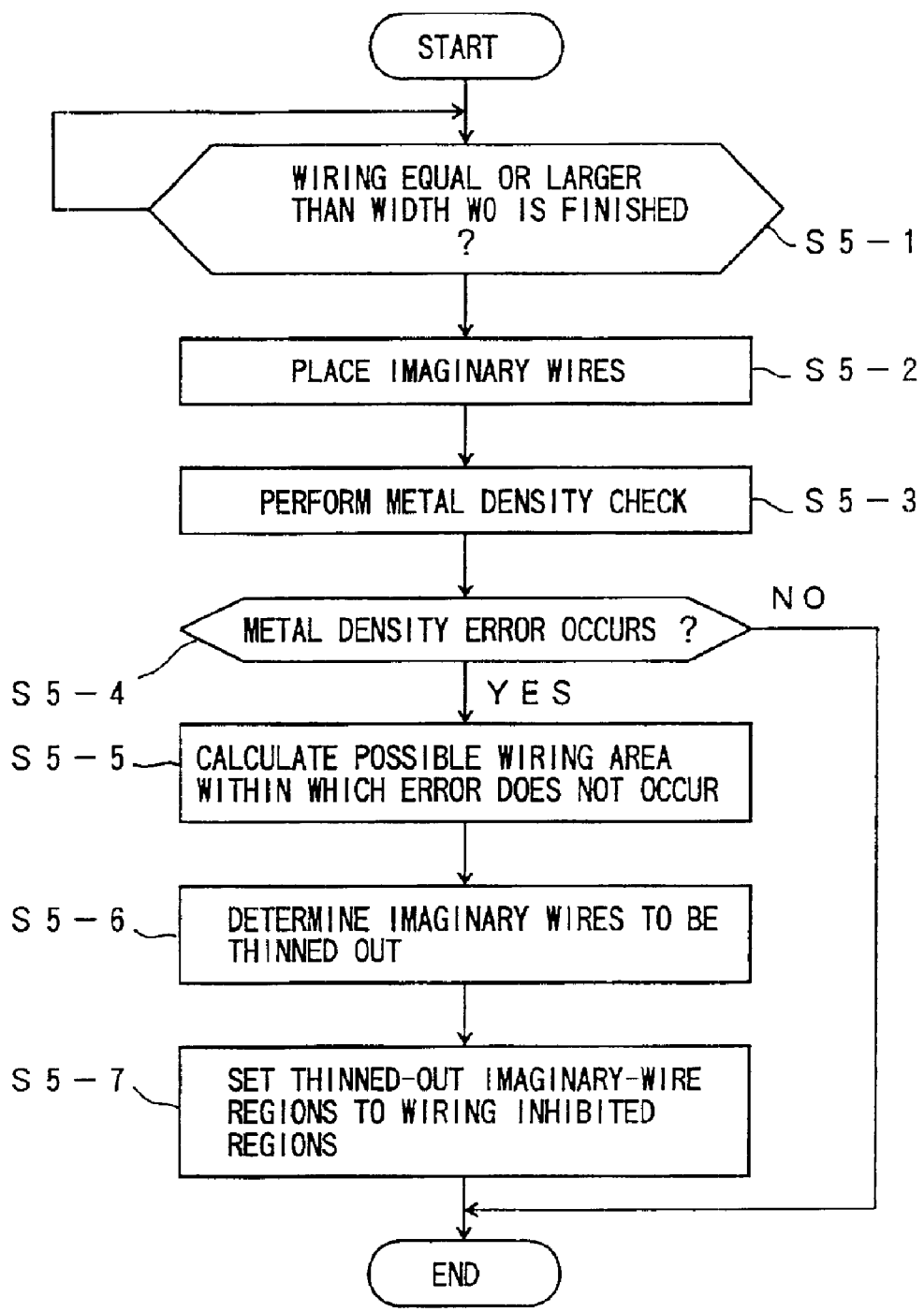
FIG. 14 shows an operation flow chart when a wiring in a second variant manner is made in one embodiment of the present invention.

FIG. 14 shows an operation flow chart when a layout of wiring is made in the second variant manner in one embodiment of the present invention.

The processing device 102 performs steps S5-1 through S5-7 shown in FIG. 14 by reading the design data processing software program when making a layout of wiring in the second variant manner.

In the step S5-1, it is determined whether or not a layout of wiring of a wire having a width equal to or larger than the predetermined width W0 is finished.

When it is determined in the step S5-1 that a layout of wiring of a wire having a width equal to or larger than a predetermined width W0 is finished, a layout of wiring of imaginary wires is made around the wire the layout of which is finished as determined in the step S5-1, in the step S5-2. The imaginary wires are general wires each having a predetermined width W20 for transmitting signals and are wires a layout of which is made imaginarily.

Then, in the step S5-3, the above-described metal density check is made.

Then, in the step S5-4, it is determined whether or not a metal density error occurs as a result of the metal density check being made in the step S5-3.

When it is determined in the step S5-4 a metal density error occurs, the number of imaginary wires within which no metal density error occurs is calculated in the step S5-5.

Then, in the step S5-6, the imaginary wires to be thinned out are determined. Then, in the step S5-7, the regions corresponding to the imaginary wires determined to be thinned out in the step S5-6 are determined to be set to wiring inhibition regions (for which a layout of wiring is inhibited).

Figure 15A:
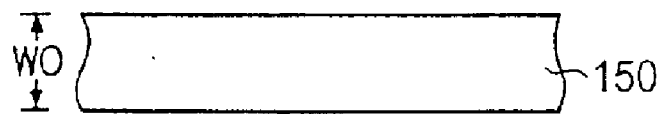
FIGS. 15A, 15B and 15C illustrate one example of operations according to the flow chart shown in FIG. 14.
Figure 15B:
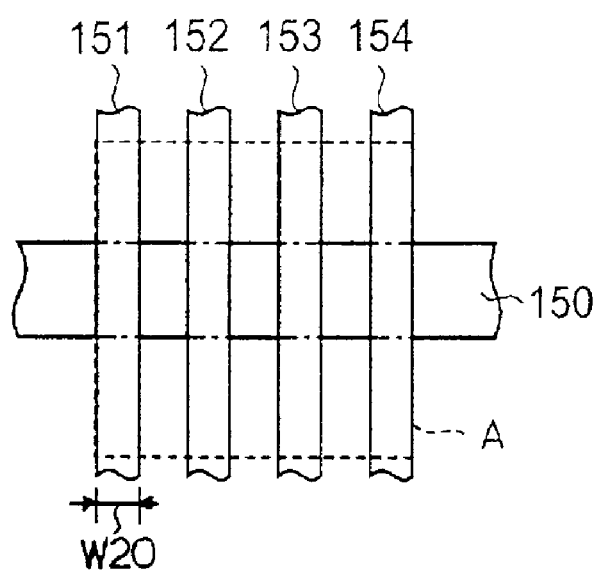
Figure 15C:
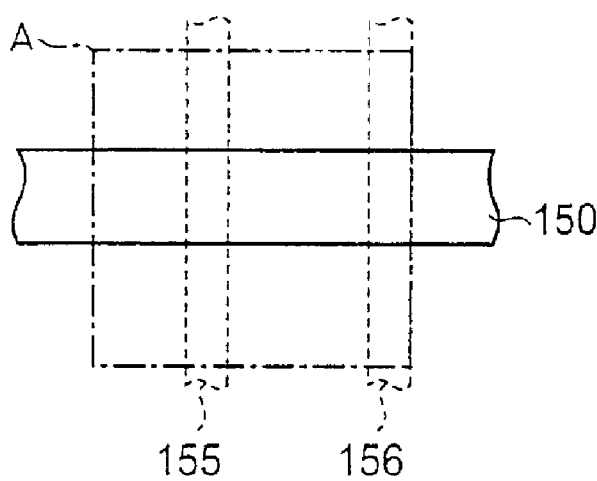

FIGS. 15A, 15B and 15C illustrate one example of a layout of wiring according to the flow chart shown in FIG. 14.

When a wire 150 having a width W0 is disposed as shown in FIG. 15A, imaginary wires 151 through 154 each having a width W20 are placed as shown in FIG. 15B. Then, when it is determined that a metal density error occurs-on a region A shown in FIG. 15B, the imaginary wires 152 and 154 are thinned out. Then, the regions 155 and 156 corresponding to the thinned-out imaginary wires 152 and 154 respectively are set to wiring inhibition regions. Then, when a layout of wiring of general wires is instructed later, a layout of wiring for the wiring inhibition regions is inhibited.

Accordingly, when a layout of wiring of general wires is made, a metal density error is prevented from occurring, and it is possible to make a layout of wiring efficiently.

Operations of the design data processing system 100 according to the design data processing software program when noise error check is made will now be described.

Figure 16:
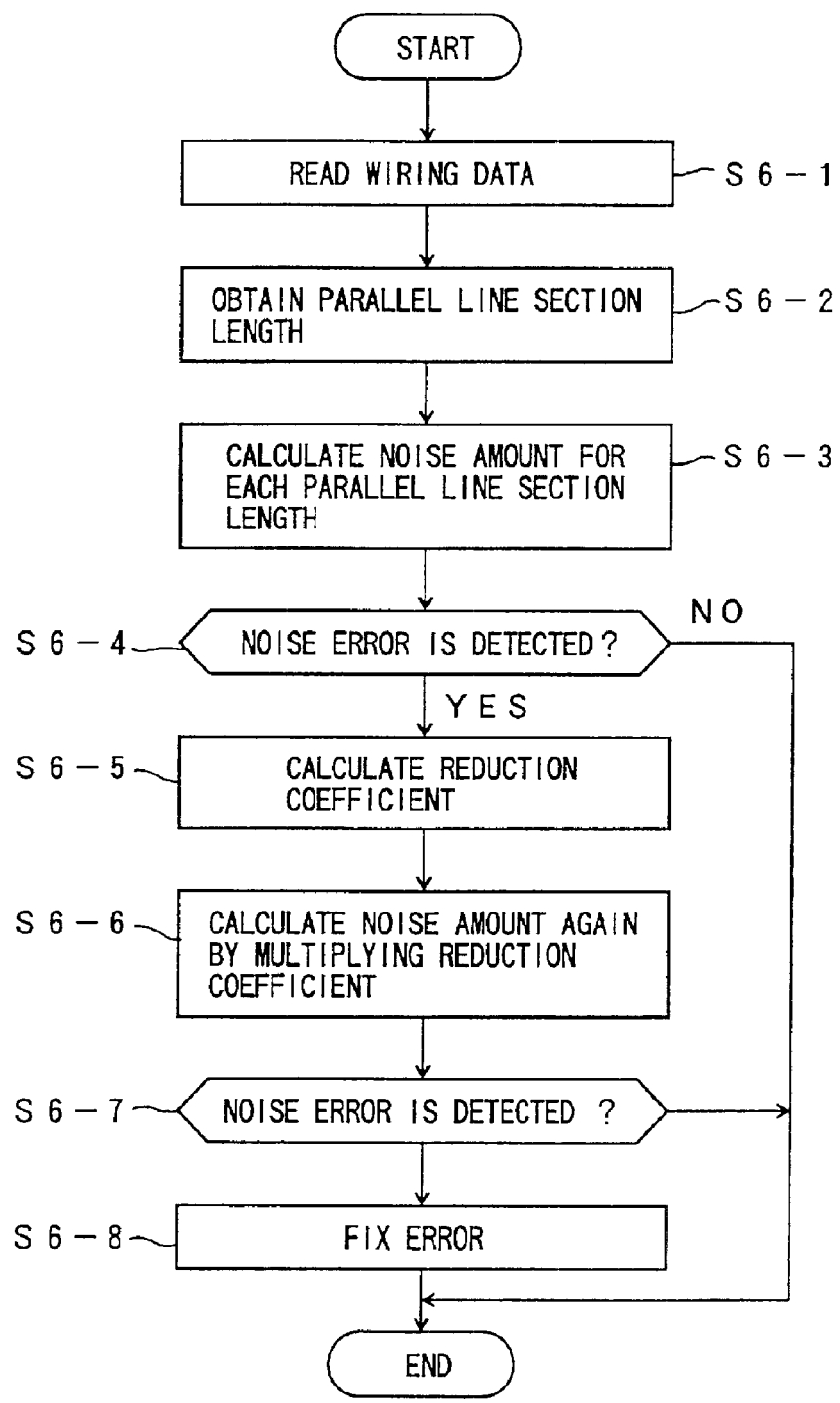
FIG. 16 shows an operation flow chart of noise error check in one embodiment of the present invention.

FIG. 16 shows an operation flow chart when noise error check is made in one embodiment of the present invention.

The processing device 102 performs steps S6-1 through S6-8 shown in FIG. 16 by reading the design data processing software program when making noise error check.

In the step S6-1, design data for a layout of wiring is read from the storage device 104. In the step S6-2, a parallel section length of wires in the layout of wiring is obtained from the read design data.

In the step S6-3, a noise amount N1 is calculated in accordance with the parallel section length of wires obtained in the step S6-2. The noise amount increase as the parallel section length increases.

In the step S6-4, it is determined whether or not a noise error is detected in accordance with the noise amount calculated in the step S6-3. When no noise error is detected in the step S6-4, the current processing is finished.

When a noise error is detected in the step S6-4, a reduction coefficient is calculated in the step S6-5. The reduction coefficient 'f' is obtained from the following expression:

$$f=F(\Sigma C, L) \quad (1)$$

where $0 < f \leq 1$.

In the above expression (1), $\Sigma C$ denotes the total length of the wires, and L denotes the wire length from the driver to the point at which the noise error is detected. The function F (x, y) is a function experimentally obtained from relationship between a total length of wires $\Sigma C$ and a wire length L from the driver to the point at which the noise error is detected.

Then, in the step S6-6, the noise amount N1 obtained in the step S6-3 is multiplied by the reduction coefficient f obtained in the step S6-5. Thus, a nose amount N2 is obtained, as follows:

$$N2=f \times N1 \quad (2)$$

At this time, $N2 \leq N1$.

Then, in the step S6-7, it is determined whether or not a noise error is detected for the noise amount N2. In the step S6-7, the noise amount N2 is compared with a predetermined value N0, and it is determined that a noise error is detected when the noise amount N2 is larger than the value N0.

When it is determined in the step S6-7 that a noise error is detected, the determination of detection of noise error is fixed in the step S6-8.

FIGS. 17, 18A, 18B and 18C illustrate one example of noise error check according to the operation flow chart shown in FIG. 16.

Figure 17:
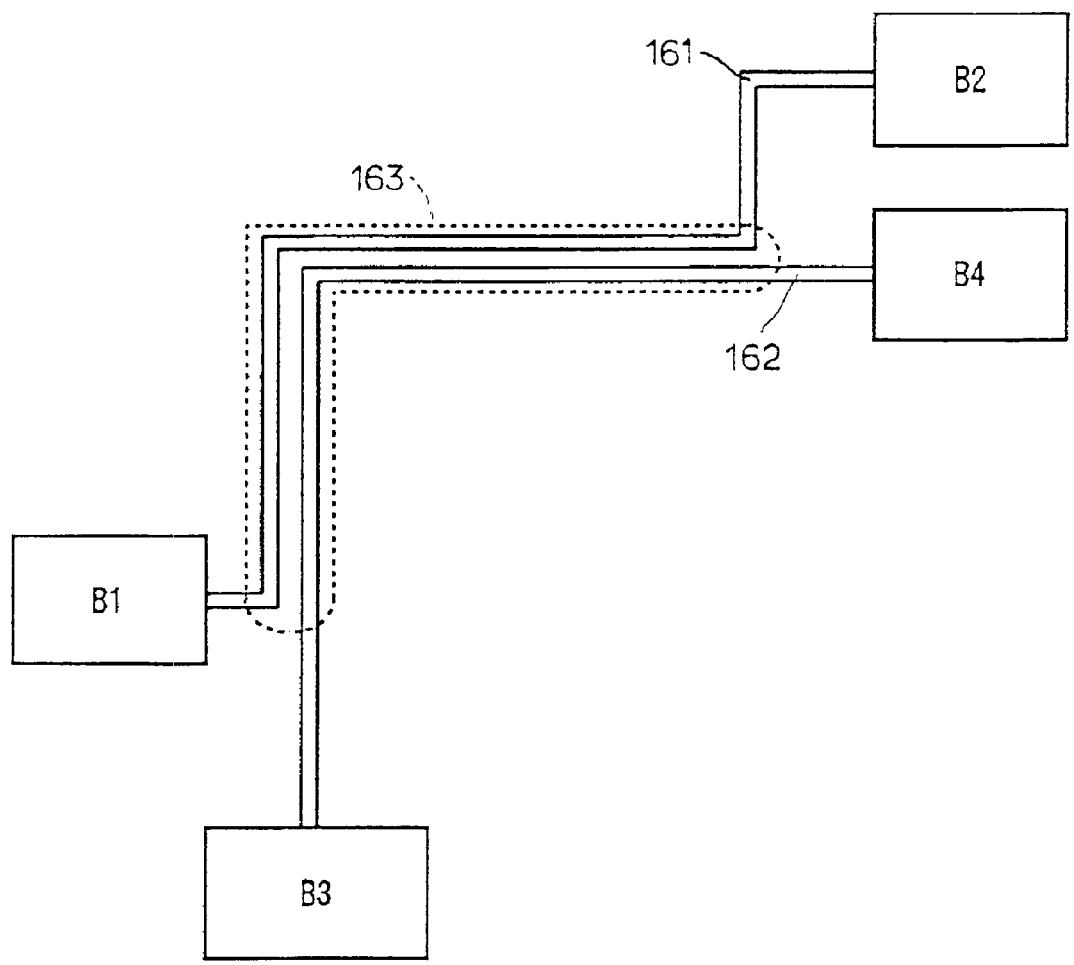
FIGS. 17, 18A, 18B and 18C illustrate one example of operations according to the flow chart shown in FIG. 16.

It is assumed that a layout of wiring is made such that a wire 161 is placed between macro blocks B1 and B2 while a wire 162 is placed between macro blocks B3 and B4, as shown in FIG. 17. In this case, a parallel section 163 exists in the wires 161 and 162, as shown in the figure.

Figure 18A:
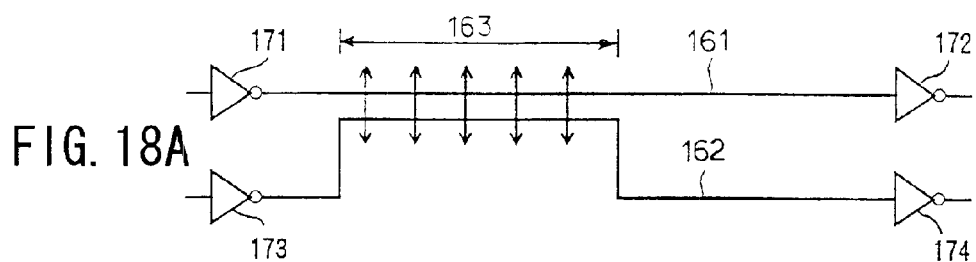
Figure 18B:
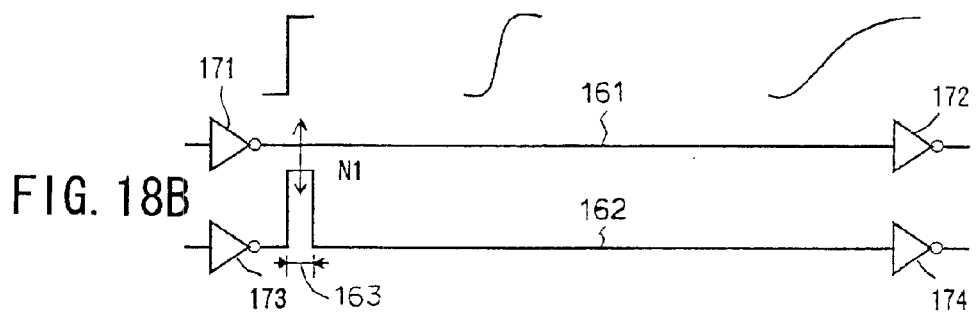
Figure 18C:
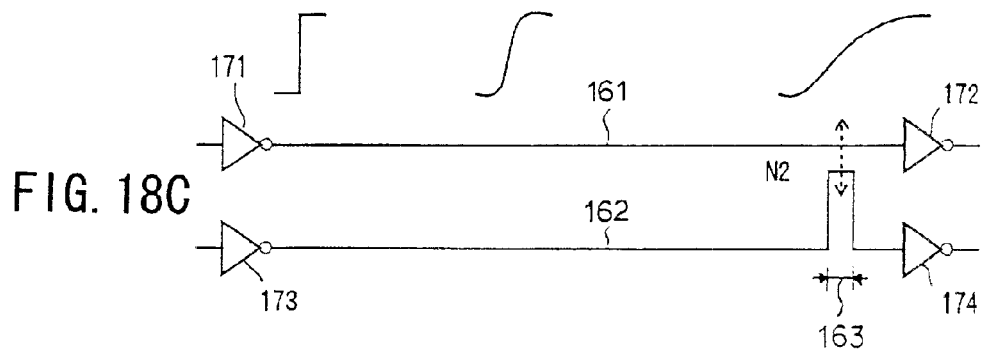

In FIGS. 18A, 18B and 18C, the wires 161 and 162 are placed between transmitting drivers 171, 172 and receiving drivers 173, 174. In the parallel section 163, signals flowing through the wires 161 and 162 are influenced by one another, and, thereby, noise is generated, as shown in FIG. 18A. As the length of the parallel section 163 increases, the amount of noise generated increases.

Further, if the parallel section 163 exists near the transmitting drivers 171, 172 as shown in FIG. 18B, because the output signal of the driver 171 changes steeply there for example, the amount of noise generated in the wire 162 therefrom is relatively large. However, if the parallel section 163 exists rather near the receiving drivers 173, 174 as shown in FIG. 18B, because the output signal of the driver 171 changes gently there for example, the amount of noise generated in the wire 162 therefrom is relatively small.

Thus, the amount of noise generated depends not only on the length of parallel section 163 but also on the position of the parallel section 163. The reduction coefficient f is calculated in consideration of the length L from the transmitting drivers 171, 172 as shown in the expression (1). Accordingly, by using the reduction coefficient f as mentioned above, it is possible to detect the possible noise amount precisely.

Thus, by tempering the calculated noise amount with the reduction coefficient f for the parallel section determined to have a noise error, it is possible to effectively reduce wires determined to have noise errors. Thereby, it is possible to make a layout of wiring efficiently.

Operations of the design data processing system 100 according to the design data processing software program when a cell is displaced will now be described.

FIG. 19 shows an operation flow chart when a cell is disposed in one embodiment of the present invention.

The processing device 102 performs steps S7-1 through S7-3 shown in FIG. 19 by reading the design data processing software program when a cell is disposed.

In the step S7-1, design data of a position where cells are disposed in a macro block is read out from the storage device 104. (The macro block is included in a layout of a rank of hierarchically designed layout data of LSI circuit, and the cells of the macro block are subordinate macro blocks included in a layout of the lower rank of the hierarchically designed layout data of LSI circuit, for example. Accordingly, to read the design data of the position where the cells are disposed in the macro block is to read the design data of the lower rank of the hierarchically designed layout data of LSI circuit corresponding to that macro block.)

Then, in the step S7-2, the region where no cell (subordinate macro block) is disposed in the macro block is obtained from the thus-read design data.

Then, in the step S7-3, the thus-obtained no-cell disposed region is set to a cell disposeable region where a new cell can be disposed.

Figure 20:
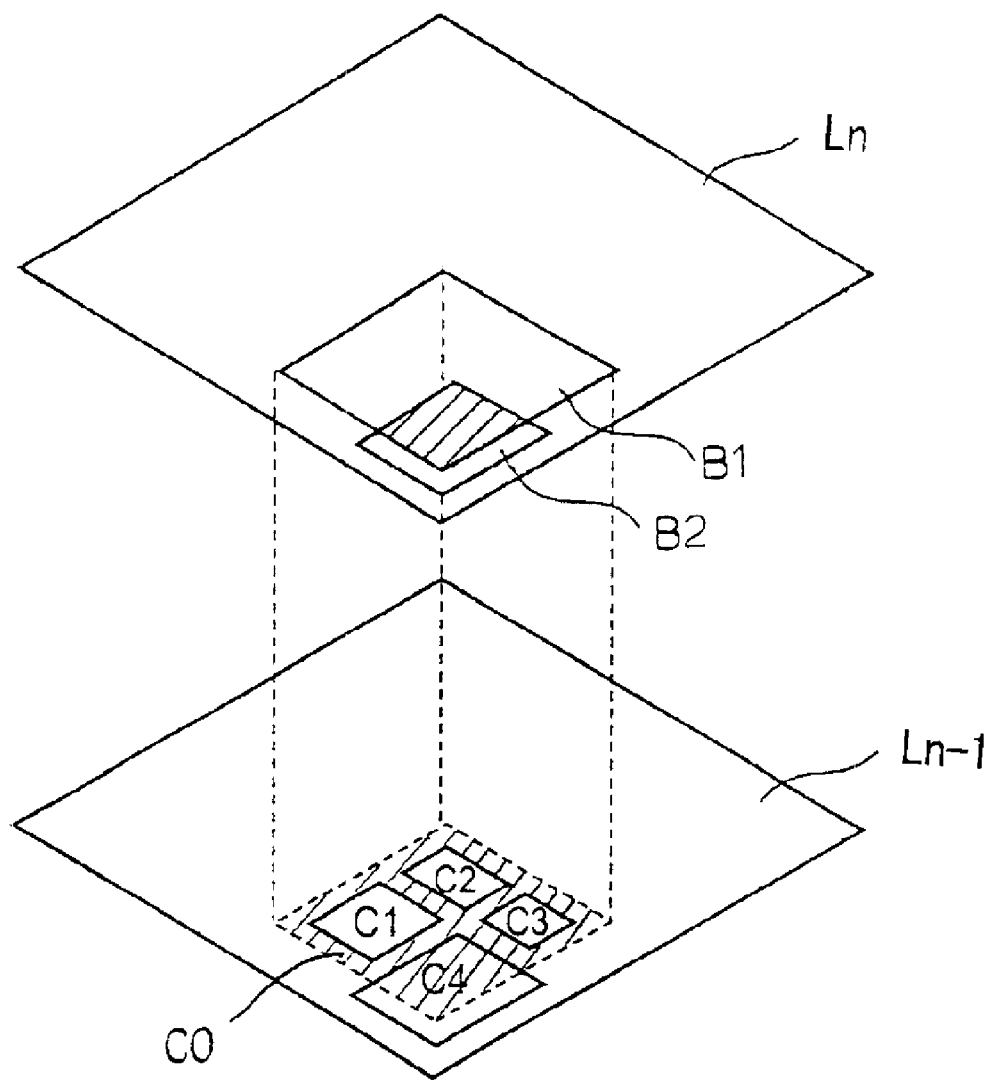
FIG. 20 illustrates one example of operations according to the flow chart shown in FIG. 19.

FIG. 20 illustrates one example of cell disposition according to the flow chart shown in FIG. 19.

A macro block B1 (included in a rank Ln of hierarchically designed layout data of LSI circuit) consists of cells (subordinate macro blocks) C1, C2 and C3 (included in a lower rank Ln–1 of the hierarchically designed layout data of LSI circuit) and a no-cell disposed region C0, as shown in FIG. 20. Then, by setting the no-cell disposed region C0 to a cell disposeable region, it is possible to dispose a new cell C4 of another macro block B2 there.

Thus, it is possible to dispose the cell C4 of the macro block B2 in the no-cell disposed region C0 of the different macro block B1. Accordingly, it is possible to efficiently dispose cells of macro blocks.

The present invention includes the following design data processing methods:

In a design data processing method of producing design data of wiring, when wires are disposed, the design data is produced such that a metal density of the wiring is less than a predetermined value.

In this method, when a width of a wire of the wiring is larger than a predetermined width, design data of the wiring is produced such that the metal density of the wiring is less than the predetermined value.

According to this method, it is possible to prevent the wiring design from deviating from the metal density rule.

Further, in a design data processing method according to the present invention, a plurality of wires are disposed with a separation therebetween more than a predetermined separation.

A design data processing method according to another aspect of the present invention includes the following steps:

a wiring step of disposing a desired wire;

a wire density detecting step of, after the wiring step, disposing predetermined wires with a predetermined separation therebetween, and detecting the density of wires; and a wiring control step of, in accordance with the detection result of the wire density detection step, controlling disposition of other wires.

A design data processing method when design data of wiring is produced according to another aspect of the present invention includes the following steps:

a first error detecting step of detecting a wiring error in accordance with a noise amount of wiring;

a noise reducing step of reducing the noise amount in accordance with the state of wiring for which the wiring error is detected in the first error detecting step; and a second error detecting step of again detecting a wiring error in accordance with the noise amount obtained in the noise reducing step.

According to this method, in a case where a wiring error is detected for wiring first, when the state of the wiring is such that problematic noise is not likely to occur, it is finally determined that no wiring error is detected therefor. Accordingly, it is possible to reduce cases where it is finally determined that a wiring error is detected. In other words, it is possible to determine, with higher accuracy, that a wiring error is detected only when a problematic noise is actually generated when the thus-designed LSI circuit is actually manufactured.

A design data processing method according to another aspect of the present invention processes design data in which a layout is made as a result of blocks are combined, and includes the following steps:

a block layout referring step of referring to, for a predetermined block, the block layout of a lower rank of hierarchy;

a not-yet-disposed region detecting step of detecting a region in which no block is disposed yet from the block layout of the lower rank referred to in the block layout referring step; and a block disposition region setting step of making setting such that another block can be disposed in the not-yet-disposed region detected in the not-yet-disposed region detecting step.

According to this method, a block can be disposed in a region of another block, in which region no block is disposed yet. Thereby, it is possible to make a layout such that an area can be effectively used, and to increase circuit integration density of LSI circuit.

The present invention is not limited to the above-described embodiments, and variations and modifications may be made without departing from the scope of the present invention.

The present application is based on Japanese priority application No. 11-320220, filed on Nov. 10, 1999, the entire contents of which are hereby incorporated by reference.

What is claimed is:

1. A design data processing method of processing hierarchically configured design data, comprising:

obtaining first design data of a lower rank of hierarchy;

obtaining second design data of a rank of hierarchy higher than the lower rank of hierarchy, after obtaining the first design data; and combining the second design data to the first design data, where when the first design data of the lower rank of hierarchy is modified after the second design data is created, the second design data is displayed together with the first design data of the lower rank of hierarchy; and wherein the hierarchy comprises a physical hierarchy including a plurality of ranks having different physical heights.

2. A computer readable recording medium storing a software program for processing hierarchically configured design data, which when executed by a computer, cause the computer to perform operations comprising:

obtaining first design data of a lower rank of hierarchy;

obtaining second design data of a rank of hierarchy higher than the lower rank of hierarchy, after obtaining the first design data; and combining the second design data to the first design data, where when the first design data of the lower rank of hierarchy is modified after the second design data is created, the second design data is displayed together with the first design data of the lower rank of hierarchy; and wherein the hierarchy comprises a physical hierarchy including a plurality of ranks having different physical heights.

3. A method of designing a hierarchical layout of a circuit, comprising:

receiving a designation of a lower rank from a user;

retrieving design data of the lower rank from a storage unit;

retrieving wiring data of an upper rank from the storage unit, after retrieving the design data;

setting the wiring data in the design data; and displaying the design data in which the wiring data has been set on a display unit, where when the design data of the lower rank is modified after the wiring data of the upper rank, the wiring data of the upper rank is displayed together with the design data of the lower rank; and wherein the design data has hierarchical data having a physical hierarchy including a plurality of ranks having different physical heights.

4. A method of designing a hierarchical layout of a large scale integrated circuit, comprising:

acquiring design data of a specified rank of the hierarchical layout of the large scale integrated circuit;

acquiring wiring data of a rank of the hierarchical layout higher than the specified rank of the hierarchical layout; and setting and displaying the wiring data in the design data of the specified rank, where when the design data of the specified rank is modified after the wiring data of the rank of the hierarchical layout higher than the specified rank, the wiring data of the rank of the hierarchical layout higher than the specified rank is displayed together with the design data of the specified rank.

5. A method of processing hierarchically configured design data, comprising:

setting and displaying wiring data of a higher rank of the hierarchically configured design data in a design data of a lower rank of the hierarchically configured design data, where when the design data of the lower rank is modified after the wiring data of the higher rank, the wiring data of the higher rank is displayed together with the design data of the specified rank.

6. A design data processing method of processing hierarchically configured design data, comprising:

obtaining first design data of a lower rank of hierarchy;

obtaining second design data of a rank of hierarchy higher than the lower rank of hierarchy, after obtaining the first design data; and combining the second design data to the first design data, where the hierarchy comprises a physical hierarchy including a plurality of ranks having different physical heights.

7. A computer readable recording medium storing a software program for processing hierarchically configured design data, which when executed by a computer, cause the computer to perform operations comprising:

obtaining first design data of a lower rank of hierarchy;

obtaining second design data of a rank of hierarchy higher than the lower rank of hierarchy, after obtaining the first design data; and combining the second design data to the first design data, where the hierarchy comprises a physical hierarchy including a plurality of ranks having different physical heights.

8. A method of designing a hierarchical layout of a circuit, comprising:

receiving a designation of a lower rank from a user and retrieving design data of the lower rank from a storage unit;

retrieving wiring data of an upper rank from the storage unit, after retrieving the design data;

setting the wiring data in the design data; and displaying the design data in which the wiring data has been set on a display unit, where the displayed data having the wiring data set comprises a physical hierarchy including a plurality of ranks having different physical heights.

* * * * *

UNITED STATES PATENT AND TRADEMARK OFFICE
CERTIFICATE OF CORRECTION

PATENT NO. : 6,874,137 B1
DATED : March 29, 2005
INVENTOR(S) : Noriyuki Ito et al.

It is certified that error appears in the above-identified patent and that said Letters Patent is hereby corrected as shown below:

<u>Column 12,</u>
Lines 22 and 56, delete ";" and insert -- , --.
Line 39, delete ";".

Signed and Sealed this

Fourth Day of April, 2006

JON W. DUDAS
*Director of the United States Patent and Trademark Office*